(12) United States Patent
Notaro et al.

(10) Patent No.: US 12,301,174 B2
(45) Date of Patent: May 13, 2025

(54) TRANSIMPEDANCE AMPLIFIER HAVING T-NETWORK FEEDBACK ARCHITECTURE AND METHOD THEREOF

(71) Applicant: BAE Systems Information and Electronic Systems Integration Inc., Nashua, NH (US)

(72) Inventors: Gregory S. Notaro, Bedford, NH (US); James M. Bock, New Boston, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 584 days.

(21) Appl. No.: 17/683,825

(22) Filed: Mar. 1, 2022

(65) Prior Publication Data
US 2023/0283244 A1    Sep. 7, 2023

(51) Int. Cl.
H03F 1/42        (2006.01)
H03F 3/45        (2006.01)

(52) U.S. Cl.
CPC .......... *H03F 1/42* (2013.01); *H03F 3/45475* (2013.01); *H03F 2200/36* (2013.01); *H03F 2203/45526* (2013.01)

(58) Field of Classification Search
CPC .... H03F 1/42; H03F 3/45475; H03F 2200/36; H03F 2203/45526; H03F 2200/129; H03F 2200/144; H03F 1/08; H03F 3/087
(Continued)

(56) References Cited

U.S. PATENT DOCUMENTS

| 4,029,976 A | 6/1977 | Fish et al. |
| 7,948,309 B2 | 5/2011 | Mak et al. |

(Continued)

FOREIGN PATENT DOCUMENTS

| GB | 2525674 | 11/2015 |
| WO | 2008031073 | 3/2008 |

(Continued)

OTHER PUBLICATIONS

Analog Engineer's Circuit Transimpedance amplifier with T-network circuit; Texas Instruments; SBOA284—Mar. 2021.
(Continued)

*Primary Examiner* — Andrea Lindgren Baltzell
*Assistant Examiner* — Jose E Pinero
(74) *Attorney, Agent, or Firm* — Sand, Sebolt & Wernow LPA; Gary McFaline

(57) ABSTRACT

A transimpedance amplifier system (TIA) for stabilizing high gain and high frequency signals while minimizing parasitic capacitance effects on the transimpedance amplifier system. The TIA includes an operational amplifier having a first input terminal, a second input terminal, and an output terminal. The TIA also includes a signal generating device operatively connected with the first input terminal of the operational amplifier. The TIA also includes a T-network feedback architecture operatively connected with the operational amplifier at the first input terminal of the operational amplifier and the output terminal of the operational amplifier. The T-network feedback architecture has a first impedance network and a second impedance network. The T-network feedback architecture is configured to suppress parasitic capacitance from the transimpedance amplifier system.

16 Claims, 5 Drawing Sheets

(58) Field of Classification Search
USPC .......................................................... 330/260
See application file for complete search history.

(56) References Cited

U.S. PATENT DOCUMENTS

| | | | |
|---|---|---|---|
| 8,264,282 | B1 | 9/2012 | Riekki et al. |
| 8,354,885 | B2 | 1/2013 | Griffith et al. |
| 8,610,495 | B2 | 12/2013 | Basaran et al. |
| 8,891,704 | B2 * | 11/2014 | McLeod ............. H03F 3/45197 |
| | | | 375/348 |
| 9,419,573 | B2 | 8/2016 | Brekelmans |
| 10,804,859 | B2 | 10/2020 | Basilico et al. |
| 2008/0012634 | A1 | 1/2008 | Oyang et al. |
| 2011/0017904 | A1 | 1/2011 | Stutz |
| 2015/0292942 | A1 | 10/2015 | Veryeras et al. |
| 2017/0201280 | A1 | 7/2017 | Hedayati et al. |
| 2020/0116563 | A1 * | 4/2020 | Costantino ............. H05K 1/181 |
| 2021/0050200 | A1 | 2/2021 | Song et al. |
| 2023/0283244 | A1 | 9/2023 | Notaro et al. |

FOREIGN PATENT DOCUMENTS

| | | |
|---|---|---|
| WO | 2012156947 | 11/2012 |
| WO | 2014165480 | 10/2014 |
| WO | 2018228772 | 12/2018 |
| WO | 2021015618 | 1/2021 |

OTHER PUBLICATIONS

International Search Report, PCT/US23/14206, mailed Jun. 1, 2023, 12 pages.

* cited by examiner

TRANSIMPEDANCE AMPLIFIER HAVING T-NETWORK FEEDBACK ARCHITECTURE AND METHOD THEREOF

TECHNICAL FIELD

The present disclosure generally relates to devices for converting electrical current signals into electrical voltage signals. More particularly, the present disclosure relates to transimpedance amplifiers for converting electrical current signals into electrical voltage signals. Specifically, the present disclosure relates to transimpedance amplifiers having T-network feedback architectures for stabilizing high gain and high frequency signals while minimizing parasitic capacitance effects on these transimpedance amplifiers.

BACKGROUND

In the electronics art, transimpedance amplifiers (hereinafter TIAs) are electrical current to electrical voltage converter circuits that are most often implemented using operational amplifiers. Currently, TIAs can be used to amplify the electrical current output of Geiger-Müller tubes, photo multiplier tubes, accelerometers, photo detectors (e.g., photodiodes), and other types of sensors that have a current response that is more linear than the voltage response. In most TIAs, TIAs convert the low-level current of a sensor into a voltage at a specific gain and bandwidth. As such, the gain, bandwidth, and current and voltage offsets change with different types of sensors requiring different configurations of TIAs.

Per these requirements, however, designers of TIAs are faced with numerous variables and/or issues when designing these TIAs, specifically total parasitic capacitance occurring in the TIAs from components provided in the TIAs. Such parasitic capacitance in TIAs are attributed to photodiode junction capacitance, printed circuit board (PCB) trace capacitance, input differential and common mode capacitance of the operational amplifier, solid state switch capacitance, and other various capacitance generated from electrical components and circuitry operatively engaged with TIAs. With such parasitic capacitance, conventional TIA configurations in high gain and high bandwidth applications have substantial limitation in signal bandwidth and distortion of outputted signals. More specifically, the parasitic capacitance in TIA feedback networks may substantially cause severe bandwidth limiting issues when a high gain configuration is implemented by means of a relatively high resistance value of a resistor provided in a negative feedback loop. Parasitic capacitances associated with the high impedance node of the circuit may contribute to potential stability problems if not mitigated properly. Finite gain bandwidth of the amplifier, coupled with the required overcompensation to counteract the phase lag induced by this parasitic capacitance and high resistance feedback resistor, may also be the leading cause of bandwidth limitation issues.

To combat these issues, designers of TIAs may use T-network feedback architectures for these types of issues. However, conventional T-network feedback architectures for TIA configurations lack accurate noise gain performance behavior with the inclusion of conventional resistor and capacitor networks used in such conventional T-network feedback architectures. In other words, these types of T-network feedback architecture of TIA configurations do not offer the suitable design flexibility to minimize and/or suppress the impacts of parasitic capacitances on closed loop bandwidth and signal bandwidth while also insuring an unconditionally stable system for high gain, high bandwidth applications.

SUMMARY

The presently disclosed transimpedance amplifier (TIA) system provides designers of TIAs with the flexibility of selecting desired components for a T-network feedback architecture to convert the low-level current signal of a sensor into a voltage signal at a specific gain and bandwidth while suppressing undesirable parasitic capacitance impacts that would otherwise degrade performance. The disclosed TIA system provides designers with the ability to reduce power consumption across the TIA by selecting suitable resistors and capacitors for the presently disclosed T-network feedback architecture. The disclosed TIA system also provides designers with the ability to allow the TIA to maintain appropriate compensation to operational amplifiers. The disclosed TIA system also provides designers with the capability of alleviating impacts to the TIA system from parasitic capacitance by selecting suitable resistors and capacitors for the presently disclosed T-network feedback architecture. As such, the TIA system disclosed herein addresses some of the inadequacies of previously known techniques and TIAs.

In one aspect, an exemplary embodiment of the present disclosure may provide a transimpedance amplifier system. The transimpedance amplifier system includes an operational amplifier having a first input terminal, a second input terminal, and an output terminal. The transimpedance amplifier system includes a T-network feedback architecture operatively connected with the operational amplifier at the first input terminal of the operational amplifier and the output terminal of the operational amplifier, the T-network feedback architecture having a first impedance network and a second impedance network. The T-network feedback architecture is configured to suppress parasitic capacitance from the transimpedance amplifier system.

This exemplary embodiment or another exemplary embodiment may further provide that the first impedance network in series with the output terminal of the operational amplifier; and wherein the second impedance network in series with the first impedance network and operatively connected with the first input terminal of the operational amplifier. This exemplary embodiment or another exemplary embodiment may further provide that the T-network feedback architecture further comprises a first pole having a first value generated by the first impedance network; and a second pole having a second value generated by the second impedance network. This exemplary embodiment or another exemplary embodiment may further provide that the first pole value and the second pole value are set equal to one another. This exemplary embodiment or another exemplary embodiment may further provide that the first pole value and the second pole value are set different from one another. This exemplary embodiment or another exemplary embodiment may further provide that the T-network feedback architecture further comprises a first capacitor of the first impedance network operatively connected with the output terminal of the operational amplifier; and a first resistor of the first impedance network operatively connected with the output terminal of the operational amplifier; wherein the first capacitor of the first impedance network is in parallel with the first resistor of the first impedance network. This exemplary embodiment or another exemplary embodiment may further provide that the T-network feedback architecture further comprises: a second capacitor of the second impedance network operatively connected with the second input terminal of the operational amplifier and the second capacitor in series with first impedance network; and a second resistor of the second impedance network operatively connected with the second input terminal of the operational amplifier and the second resistor in series with first impedance network; wherein the second capacitor of the second impedance network is in parallel with the second resistor of the second impedance network. This exemplary embodiment or another exemplary embodiment may further provide that the T-network feedback architecture further comprises: a ground resistor operatively connected with an output of the first impedance network and operatively connected with an input of the second impedance network. This exemplary embodiment or another exemplary embodiment may further provide that the T-network feedback architecture further comprises: a first resistance value defined by the first resistor; a second resistance value defined by the second resistor; and a third resistance value defined by the ground resistor; wherein the third resistance value is different than each of the first resistance value and the second resistance value. This exemplary embodiment or another exemplary embodiment may further provide that the third resistance value of the ground resistor is greater than each of the first resistance value of the first resistor and the second resistance value of the second resistor. This exemplary embodiment or another exemplary embodiment may further provide that the third resistance value of the ground resistor is less than each of the first resistance value of the first resistor and the second resistance value of the second resistor. This exemplary embodiment or another exemplary embodiment may further comprise a third capacitor in series with the T-network feedback architecture and operatively connected with the first input terminal of the operational amplifier; and a first zero value generated by the first resistor, the second resistor, the third resistor, and the third capacitor. This exemplary embodiment or another exemplary embodiment may further provide that the T-network feedback architecture further comprises a first capacitance value defined by the first capacitor of the first impedance network; and a second capacitance value defined by the second capacitor of the second impedance network; wherein the first capacitance value and the second capacitance value is equal to one another; and wherein the first capacitance value and the second capacitance value is greater than the parasitic capacitance imposed across each of first impedance network and the second impedance network. This exemplary embodiment or another exemplary embodiment may further provide that the T-network feedback architecture further comprises a first capacitance value defined by the first capacitor of the first impedance network; and a second capacitance value defined by the second capacitor of the second impedance network; wherein the first capacitance value and the second capacitance value is different from one another; and wherein the first capacitance value and the second capacitance value is greater than the parasitic capacitance imposed across each of first impedance network and the second impedance network. This exemplary embodiment or another exemplary embodiment may further comprise a second zero value generated by the first capacitor, the second capacitor, the third resistor, and the third capacitor; wherein the second zero value is greater than the first zero value. This exemplary embodiment or another exemplary embodiment may further comprise a common mode voltage source operatively connected with the second input terminal of the operational amplifier.

In another aspect, an exemplary embodiment of the present disclosure may provide a T-network feedback architecture with an operational amplifier. The T-network feedback architecture comprises a first impedance network in series with an output terminal of the operational amplifier. The T-network feedback architecture also comprises a second impedance network in series with the first impedance network and operatively connected with an input terminal of the operational amplifier. The T-network feedback architecture also comprises a first pole having a first value generated by the first impedance network. The T-network feedback architecture also comprises a second pole having a second value generated by the second impedance network; wherein the first pole value and the second pole value are set equal to one another.

This exemplary embodiment or another exemplary embodiment may further provide that the T-network feedback architecture further comprises a first capacitor of the first impedance network operatively connected with the output terminal of the operational amplifier; and a first resistor of the first impedance network operatively connected with the output terminal of the operational amplifier; wherein the first capacitor of the first impedance network is in parallel with the first resistor of the first impedance network. This exemplary embodiment or another exemplary embodiment may further provide that the T-network feedback architecture further comprises a second capacitor of the second impedance network operatively connected with the second input terminal of the operational amplifier and in series with first impedance network; and a first resistor of the second impedance network operatively connected with the second input terminal of the operational amplifier and in series with first impedance network; wherein the second capacitor of the second impedance network is in parallel with the second resistor of the second impedance network. This exemplary embodiment or another exemplary embodiment may further provide that the T-network feedback architecture further comprises a ground resistor operatively connected with an output of the first impedance network and operatively connected with an input of the second impedance network.

In yet another aspect, an exemplary embodiment of the present disclosure may provide a method. The method comprising steps of transmitting an input current, via a signal generating device, to an inverting input terminal of an operational amplifier; converting the input current to a first output voltage with a first gain value via the operational amplifier; outputting the first output voltage, via the operational amplifier, to a first impedance network; outputting a second output voltage with a second gain value, via the first impedance network, to a second impedance network, wherein the second gain value is different than the first gain value; and outputting a third output voltage with a third gain value, via the second impedance network, to an inverting input terminal of the operational amplifier, wherein the third gain value is greater than the second gain value.

This exemplary embodiment or another exemplary embodiment may further provide that the step of outputting a second output voltage with a second gain value, via the first impedance network, to a second impedance network further includes that the first impedance network comprises: defining a first resistance value by a first resistor; and defining a first capacitance value by a first capacitor. This exemplary embodiment or another exemplary embodiment may further provide that the step of outputting a third output voltage with a third gain value, via the second impedance network, to a second input terminal of the operational amplifier further includes that the second impedance network comprises: defining a second resistance value by a second resistor that is equal to the first resistance value defined by the first resistor; and defining a second capacitance value by a second capacitor that is equal to the first capacitance value defined by the first capacitor. This exemplary embodiment or another exemplary embodiment may further provide a step of outputting the second output voltage with the second gain value, via the first impedance network, to a third resistor defining a third resistance value that is less than the first resistance value of the first resistor and less than the second resistance value of the second resistor.

BRIEF DESCRIPTION OF THE SEVERAL VIEWS OF THE DRAWINGS

Sample embodiments of the present disclosure are set forth in the following description, are shown in the drawings and are particularly and distinctly pointed out and set forth in the appended claims.

Similar numbers refer to similar parts throughout the drawings.

DETAILED DESCRIPTION

Figure 1:
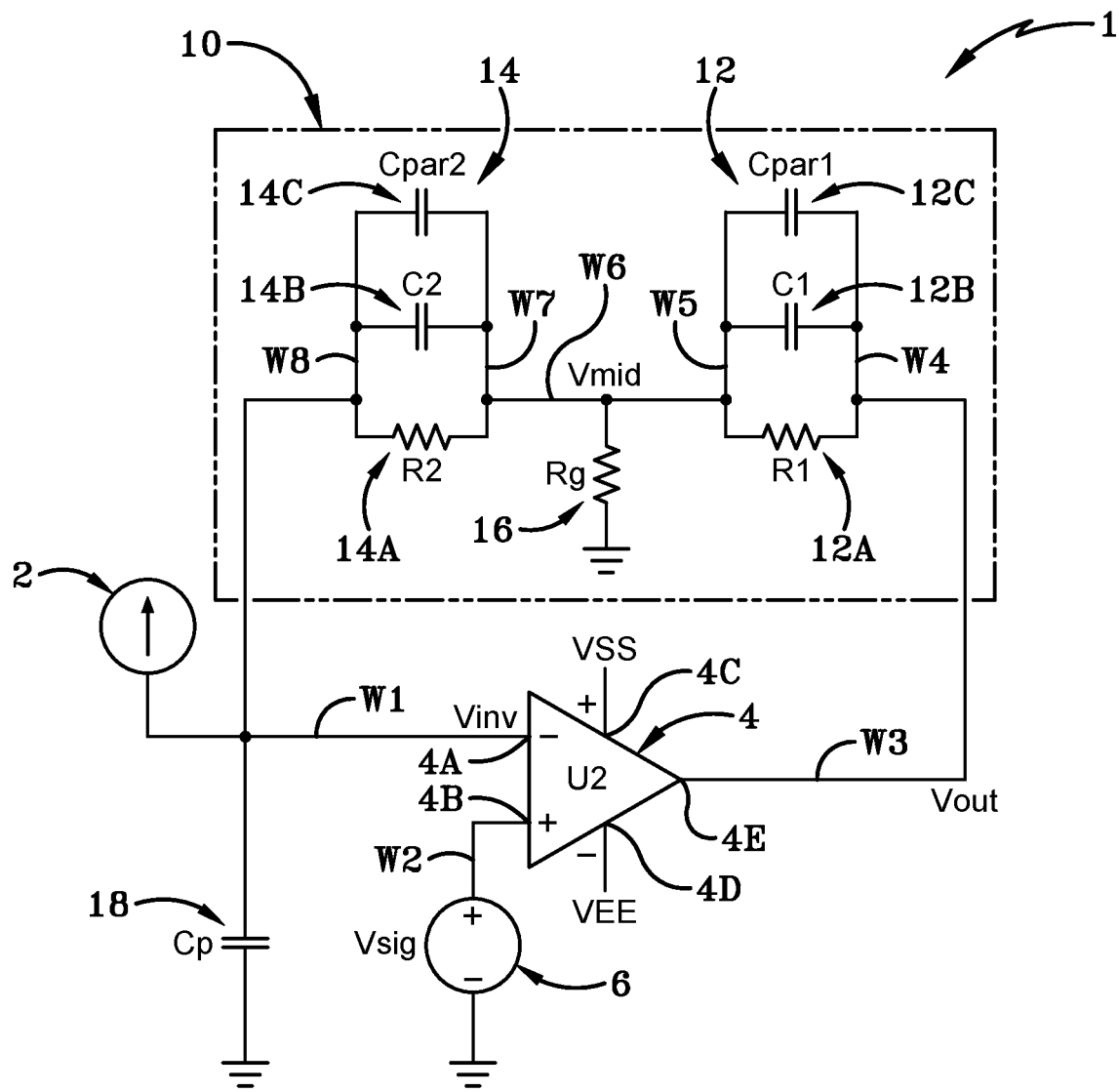
FIG. 1 is a schematic diagram of a transimpedance amplifier system in accordance with one aspect of the present disclosure.

FIG. 1 illustrates a transimpedance amplifier system (hereinafter referred to "TIA") which is generally referred to as 1. In the illustrated embodiment, the TIA 1 may include a fixed high gain setting and fixed low gain setting, which is described in more detail below. The TIA 1 may also be a programmable gain TIA that includes a fixed high gain setting and fixed low gain setting controlled by at least one ON and OFF control component that is suitable for a TIA. In one exemplary embodiment, a TIA may include an ON and OFF control component that is a solid state switch. In another exemplary embodiment, a TIA may include an ON and OFF control component that is at least one transistor. In another exemplary embodiment, any suitable electrical component and/or device may be used that is capable of providing an ON and OFF control component to switch between a high gain setting and a low gain setting for the TIA.

It should be understood that any suitable electrical connection may be used to electrically connect devices and/or components in the TIA 1 with one another. As such, any common or conventional electrical connection may be used herein to electrically connect devices and/or components in the TIA 1 with one another for transferring signals, power, and other information inside of the TIA 1 during operation.

Referring to FIG. 1, TIA 1 includes at least one signal sensing device or sensor 2. The at least one sensor 2 collects data and/or information based on the specific design of the at least one signal sensing device 2. Upon collecting this data, the at least one sensor 2 converts the collected data into an electrical current to be useful in the TIA 1. In the illustrated embodiment, the at least one sensor 2 is a photodiode device that is capable of receiving a light signal (i.e., data and/or information) and converting said light signal into an electrical current for the TIA 1. In other exemplary embodiments, any suitable signal sensing device or sensor may be used in a TIA described and illustrated herein for collecting data and/or information per its designated function and converting said collected data and/or information into an electrical current signal. In other exemplary embodiments, at least one sensor may have any associated polarity based on the application of the at least one sensor in a TIA.

Still referring to FIG. 1, TIA 1 includes at least one operational amplifier 4 (hereinafter referred to "op-amp") electrically connected with the at least one sensor 2, which is described in more detail below. The op-amp 4 provided herein is arranged in a non-inverting configuration that includes a first input terminal or inverting terminal 4A, a second input terminal or non-inverting terminal 4B, a first voltage input or voltage positive input 4C, a second voltage input or voltage negative input 4D, and a voltage output terminal 4E. Additionally, the op-amp 4 described and illustrated herein is an ideal op-amp that includes ideal characteristics associated with the operation of the op-amp 4 (e.g., infinite open-lop gain, infinite input impedance, zero output impedance, infinite bandwidth, zero noise, etc.).

Referring to FIG. 1, the at least one sensor 2 is operatively connected with the op-amp 4. Specifically, the at least one sensor 2 is electrically connected with the op-amp 4 via a first electrical connection W1. As illustrated in FIG. 1, the first electrical connection W1 connects an output of the at least sensor 2 to the first input terminal 4A of the op-amp 4. With this electrical connection, the at least one sensor 2 outputs an electrical current signal to the op-amp 4 via the first electrical connection W1. Additionally, the op-amp 4 is powered at the first voltage input 4C and the second voltage input 4D via a power source (not illustrated herein).

Still referring to FIG. 1, TIA 1 also includes a common mode voltage source 6. The common mode voltage source 6 includes a first or positive terminal 6A and a second or negative terminal 6B. The common mode voltage source 6 may also be a voltage source that outputs a small alternating current (AC) signal superimposed over a direct current (DC) common mode voltage that is applied and swept over a frequency range to measure the noise gain transfer function of TIA 1. As illustrated in FIG. 1, the common mode voltage source 6 operatively connects with the op-amp 4. Specifically, the common mode voltage source 6 electrically connects with the op-amp 4, via a second electrical connection W2, at the positive terminal 6A of the common mode voltage source 6 and at the second input terminal 4B of the op-amp 4. Additionally, the negative terminal 6B of the common mode voltage source 6 is electrically connected to ground.

In TIA 1, the common mode voltage source 6 delivers an equivalent voltage to the op-amp 4 in the TIA 1 due to the TIA 1 using a negative feedback loop, which is described in further detail below. As such, the common mode voltage source 6 assists in the prevention of generating distorted output signals in TIA 1 by managing the input voltage being delivered into the op-amp 4 during operation. As described and illustrated herein, TIA 1 includes a bi-polar voltage supply application where a DC input common mode voltage is not required. Here, the common mode voltage source 6 may be replaced with a direct connection to ground when there are no design constraints limiting operation to a specific common mode range. The common mode voltage source 6 may also be replaced with a direct connection to ground when there is no need for shifting a DC output offset voltage of the op-amp 4. During operation, any DC input common mode voltage applied via the common mode voltage source 6 will be amplified by the DC nose gain of the TIA 1 and is managed appropriately, which is described in more detail below.

In other exemplary embodiments, any suitable number of voltage sources may be used in a TIA described and illustrated herein. In one instance, a TIA may include a single common mode voltage source where the single common mode voltage source provides a DC input common mode bias. This DC input common mode bias may be applied via the common mode voltage source to accommodate for limited operational input voltage range of an op-amp and/or input common mode restrictions. In this instance, the input common mode voltage from the common mode voltage source may also provide a DC output offset bias for downstream electronics in the circuit.

Still referring to FIG. 1, TIA 1 includes a T-network feedback architecture 10 (hereinafter referred to as "T-network") that is electrically connected with the op-amp 4. As described in more detail below, the T-network 10 and the op-amp 4 are electrically connected in parallel with one another in TIA 1. The T-network 10 is capable of managing the DC input common mode voltage applied by the common mode voltage source 6 which is then amplified by the DC nose gain of the TIA 1. As such, the DC noise gain will be non-unity and will result in amplification of this DC voltage by implementing the T-network 10 described and illustrated herein. Additionally, the gain can be controlled by proper sizing of the resistors in the T-network 10, which is described in more detail below.

Still referring to FIG. 1, the T-network 10 includes a first impedance network 12 that is operatively engaged with the op-amp 4. Specifically, the first impedance network 12 is electrically connected with the op-amp 4 via a third electrical connection W3 where the output terminal 4E of the op-amp 4 is in series with an input of the first impedance network 12. In the illustrated embodiment, the first impedance network 12 includes a first resistor 12A that is electrically connected with the op-amp 4 via the third electrical connection W3 at an input terminal of the first resistor 12A. The first resistor 12A of the first impedance network 12 also defines a first resistance value "R1" as shown in FIG. 1. The first impedance network 12 also includes a first capacitor 12B that is electrically connected with the op-amp 4 via the third electrical connection W3 at an input terminal of the first capacitor 12B. The first capacitor 12B of the first impedance network 12 also defines a first capacitance value "C1" as shown in FIG. 1.

Still referring to FIG. 1, the first resistor 12A and the first capacitor 12B of the first impedance network 12 are also electrically connected in parallel with one another via a fourth electrical connection W4 and a fifth electrical connection W5. Specifically, the fourth electrical connection W4 electrically connects the input terminal of the first resistor 12A with the input terminal of the first capacitor 12B, and the fifth electrical connection W5 electrically connects an output terminal of the first resistor 12A with an output terminal of the first capacitor 12B.

Still referring to FIG. 1, the first impedance network 12 also includes a first parasitic capacitance 12C that is generated within the first impedance network 12 via the first capacitor 12B. The first parasitic capacitance 12C illustrated herein defines a first parasitic capacitance value "Cpar1" which is less than the first capacitance value C1 of the first capacitor 12B. Such occurrence of the first parasitic capacitance 12C during operation of the TIA 1 is described in more detail below.

Still referring to FIG. 1, the T-network 10 includes a second impedance network 14 that is electrically connected with the first impedance network 12. Specifically, the second impedance network 14 is electrically connected with the first impedance network 12 via a sixth electrical connection W6 where an output terminal of the first impedance network 12 is in series with an input of the second impedance network 14.

In the illustrated embodiment, the second impedance network 14 includes a second resistor 14A that is electrically connected with the first impedance network 12 via the sixth electrical connection W6 at an input terminal of the second resistor 14A. The second resistor 14A of the second impedance network 14 also defines a second resistance value "R2" as shown in FIG. 1. In the illustrated embodiment, the second resistance value "R2" of the second resistor 14A is substantially equal to the first resistance value "R1" of the first resistor 12A.

Figure 2:
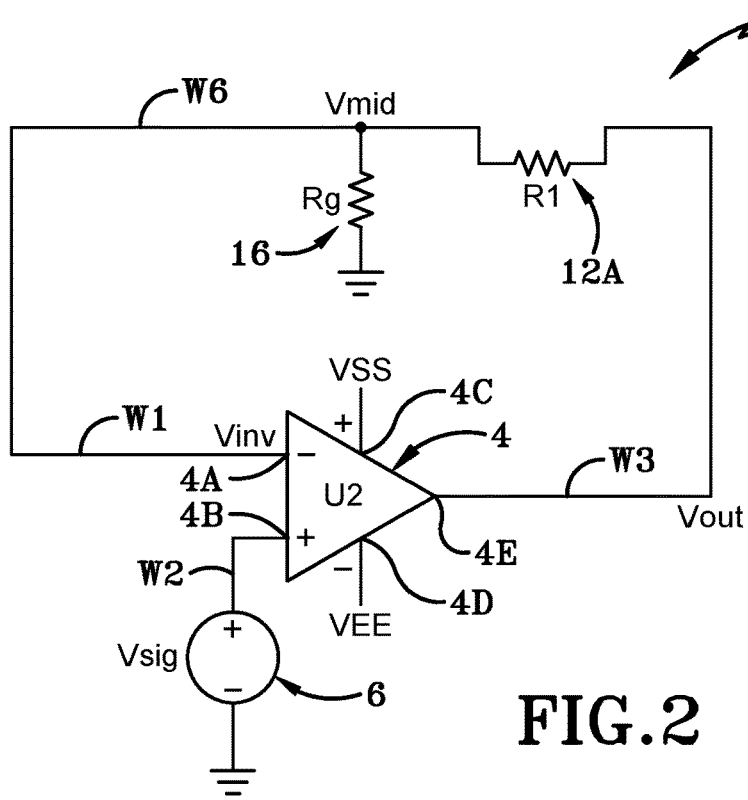
FIG. 2 is a schematic diagram of a lower frequency gain model of the transimpedance amplifier system.

In other exemplary embodiments, first and second resistors of first and second impedance networks may define any suitable resistance values for a TIA based on various considerations, including the desired gain needed to be generated in the TIA. In one exemplary embodiment, a first resistor value of a first resistor of a first impedance network may be greater than a second resistor value of a second resistor of a second impedance network. In another exemplary embodiment, a first resistor value of a first resistor of a first impedance network may be less than a second resistor value of a second resistor of a second impedance network. In another exemplary embodiment, a first resistor value of a first resistor of a first impedance network may be equal to a second resistor value of a second resistor of a second impedance network Still referring to FIG. 1, the second impedance network 14 also includes a second capacitor 14B that is electrically connected with the first impedance network 12 via the sixth electrical connection W6 at an input terminal of the second capacitor 14B. The second capacitor 14B of the second impedance network 14 also defines a second capacitance value "C2" as shown in FIG. 2. In the illustrated embodiment, the second capacitance value "C2" of the second capacitor 14B is substantially equal to the first capacitance value "C1" of the first capacitor 12B.

In other exemplary embodiments, first and second capacitors of first and second impedance networks may define any suitable capacitance values for a TIA based on various considerations, including the parasitic capacitance generated by electrical components electrically connected in the TIA (e.g., photodiode junction capacitance, PCB trace capacitance, input differential, and common mode capacitance of the op-amp, and solid state switch capacitance). In one exemplary embodiment, a first capacitance value of a first capacitor of a first impedance network may be greater than a second capacitance value of a second capacitor of a second impedance network. In another exemplary embodiment, a first capacitance value of a first capacitor of a first impedance network may be less than a second capacitance value of a second capacitor of a second impedance network. In another exemplary embodiment, a first capacitance value of a first capacitor of a first impedance network may be equal to a second capacitance value of a second capacitor of a second impedance network.

Still referring to FIG. 1, the second resistor 14A and the second capacitor 14B of the second impedance network 14 are also electrically connected in parallel with one another via a seventh electrical connection W7 and an eighth electrical connection W8. Specifically, the seventh electrical connection W7 electrically connects the input terminal of the second resistor 14A with the input terminal of the second capacitor 14B, and the eighth electrical connection W8 electrically connects an output terminal of the second resistor 14A with an output terminal of the second capacitor 14B.

Still referring to FIG. 1, the second impedance network 14 also includes a second parasitic capacitance 14C that is generated within the second impedance network 14 via the second capacitor 14B. The second parasitic capacitance 14C illustrated herein defines a second parasitic capacitance value "Cpar2" that is less than the second capacitance value "C2" of the second capacitor 14B. Such occurrence of the second parasitic capacitance 14C during operation of the TIA 1 is described in more detail below.

Still referring to FIG. 1, the second impedance network 14 operatively connects with the op-amp 4. Specifically, the first electrical connection W1 electrically connects at an output of the second impedance network 14 with the first input terminal 4A of the op-amp 4. Such connection between the op-amp 4 and the second impedance network 14 provides a negative feedback loop for the op-amp 4.

The use of the first capacitor 12B in the first impedance network 12 and the second capacitor 14B in the second impedance network 14 is considered advantageous at least because the first and second capacitors 12B, 14B improve stability of the outputted voltage signal and compensate the T-network feedback architecture 10 when parasitic capacitance is generated in the closed loop of TIA 1 by applying appropriate amounts of phase boost compensation in order to counteract the phase lag induced by parasitic capacitance Cp. In comparison to previous known TIA, the inclusion of the first and second capacitors 12B, 14B in the first and second impedance networks 12, 14 presented herein introduces two poles for the noise gain of TIA 1 while also setting the signal bandwidth in TIA 1, which is described in more detail below. Moreover, the equivalent capacitance values "C1", "C2" of the first and second capacitors 12B, 14B in the first and second impedance networks 12, 14 mitigates and/or minimizes against the potential parasitic capacitance that causes detrimental effects from a signal bandwidth generated by the at least one sensor 2, the op-amp 4, and the first and second capacitors 12B, 14B in TIA 1. The inclusion of the first and second capacitors 12B, 14B also provides a pole-zero cancellation effect that mitigates for additional phase lag induced by a second zero in the noise gain transfer function.

Still referring to FIG. 1, TIA 1 also includes a third or ground resistor 16 that is operatively engaged with the first impedance network 12 and the second impedance network 14. Specifically, the third resistor 16 is electrically connected with the first impedance network 12 via the sixth electrical connection W6 at the output terminal of the first impedance network 12 and an input terminal of the third resistor 16. The third resistor 16 is also electrically connected with the second impedance network via the sixth electrical connection W6 at the input terminal of the second impedance network 14 and the input terminal of the third resistor 16. The third resistor 16 is also electrically connected to ground at an output terminal of the third resistor 16.

Still referring to FIG. 1, the third resistor 16 defines a third resistance value "Rg". In the illustrated embodiment, the third resistance value "Rg" of the third resistor 16 is less than the first resistance value "R1" of the first resistor 12A of the first impedance network 12 and less than the second resistance value "R2" of the second resistor 14B of the second impedance network 14. In other exemplary embodiments, a third resistance value of a third resistor may have any suitable resistance value relative to a first resistance value of a first resistor of a first impedance network and/or a second resistance value of a second resistor of a second impedance network. In one exemplary embodiment, a third resistance value of a third resistor is greater than a first resistance value of a first resistor of a first impedance network and/or a second resistance value of a second resistor of a second impedance network.

The equivalent resistance values "R1" and "R2" of the first and second resistors 12A, 14A of the first and second impedance networks 12, 14 along with the first and second capacitors 14A, 14B is considered advantageous at least because these networks 12, 14 provide design freedom to minimize power consumption of TIA 1 while also maintaining appropriate compensation of function in TIA 1. The equivalent resistance values "R1" and "R2" of the first and second resistors 12A, 14A of the first and second impedance networks 12, 14 along with the first and second capacitors 14A, 14B also alleviates impacts from parasitic capacitances generated by components in TIA 1 and other components or circuit electrically connected with TIA 1.

Still referring to FIG. 1, TIA 1 also includes a total parasitic capacitance that is symbolically referenced as a capacitor symbol labeled 18. The total parasitic capacitance 18 represents the total equivalent parasitic capacitance at the first input terminal 4A of the op-amp 4. The total equivalent parasitic capacitance symbolized by total parasitic capacitance 18 is contributed to at least one sensor junction capacitance (e.g., photodiode junction capacitance), PCB trace capacitance, input differential and common mode capacitance generated from the op-amp 4, solid state switch capacitance, and other electrical components and/or device electrically connected with the TIA 1 that may contribute parasitic capacitance.

Having now described the components of the TIA 1, a method of calculating desired parameters for the T-network 10 of the TIA 1 is described in more detail below.

Referring to FIGS. 2-6, the noise gain of the TIA 1 can be determined via the noise gain function shown in Equation 1:

$$NG = \frac{Vout}{Vsig} \qquad \text{Equation 1}$$

where "Vout" is the voltage outputted from the op-amp and "Vsig" is the voltage signal inputted into the op-amp 4. Equation 1 will be referenced below to further determine the desired parameters for the T-network 10 of the TIA 1 to mitigate and minimize unwanted parasitic capacitance while still amplifying electrical current output from the at least one sensor 2 with minimal comprises to gain and bandwidth.

Referring to FIG. 2, the schematic diagram of TIA 1 illustrates a model 1A of TIA 1 for determining a low frequency noise gain function of TIA 1. Since this model illustrates the use of low frequency gain in a direct current circuit, the first capacitor 12B and the second capacitor 14B are removed from this model since the impedance of the first capacitor 12B and the second capacitor 14B are considered infinite; in other words, the first capacitor 12B and the second capacitor 14B are essentially open circuits in this model. As such, the model only illustrates the first resistor 12A of the first impedance network 12 and the third resistor 16 being in series with the op-amp 4. With this model, Equation 2 is used to determine the low frequency noise gain function of TIA 1:

$$NG = 1 + \frac{R1}{Rg} \quad \text{Equation 2}$$

where "R1" represents the first resistance value of the first resistor 12A (as described above) and "Rg" represents the third resistance value of the third resistor 16 (also described above). With Equation 2, a desired low frequency noise gain for a TIA disclosed herein may be determined by using any suitable resistance value defined by resistors operable to use in the TIA. In one example, a resistance value of 10 kΩ of a first resistor (specifically "R1") and another resistance value of 10Ω of a third resistor (specifically "Rg") calculates a low frequency noise gain value of about 60 decibels. In other exemplary embodiments, any suitable low frequency noise gain for a TIA may be determined by use of Equation 1.

Figure 3:
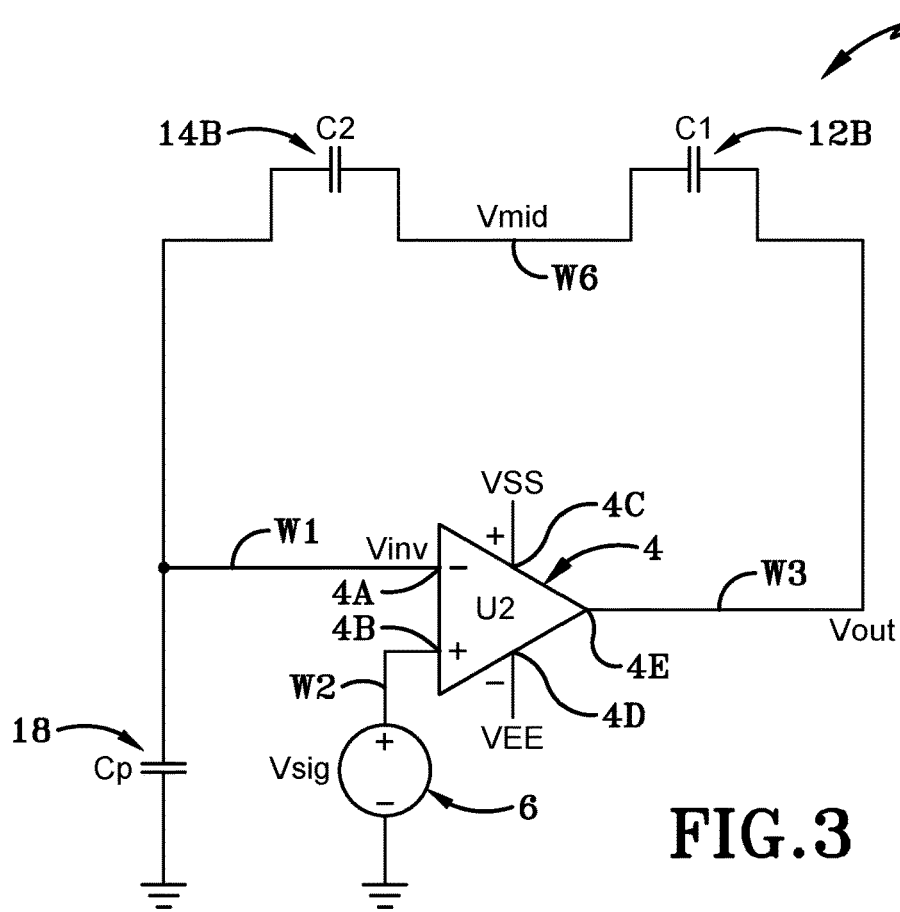
FIG. 3 is a schematic diagram of a high frequency gain model of the transimpedance amplifier system.

Referring to FIG. 3, the schematic diagram of TIA 1 illustrates a model 1B of TIA 1 for determining a high frequency noise gain function of TIA 1. Since this model illustrates the use of high frequency gain in a small signal AC circuit, the first resistor 12A of the first impedance network 12, the second resistor 14A of the second impedance network 14, and the third resistor 16 are removed from this model due to the dominant low impedances of the first and second capacitors 12B, 14B at high frequencies. Upon this stipulation, the model only illustrates the first capacitor 12B of the first impedance network 12, the second capacitor 14B of the second impedance network 14, and the total parasitic capacitance 18 of TIA 1. In the model, the second capacitor 14B is electrically connected in series with the total parasitic capacitance 18. The first capacitor 12B is also electrically connected in parallel with the series combination of the second capacitor 14B and the total parasitic capacitance 18. Additionally, the first and second capacitors 12B, 14B are operatively connected in series with the feedback path of TIA 1. As such, the output voltage of TIA 1 is divided amongst the first capacitor 12B, the second capacitor 14B, and the total equivalent parasitic capacitance 18. With this model, Equation 3 is used to determine the high frequency noise gain function of TIA 1:

$$NG = 1 + \frac{Cp}{\left(\frac{C1 \cdot C2}{C1 + C2}\right)} \quad \text{Equation 3}$$

where "C1" is the first capacitance value of the first capacitor 12B (as described above), "C2" is the second capacitance value of the second capacitor 14B (also described above), and "Cp" is the parasitic capacitance value of the total parasitic capacitance 18 (also described above). With Equation 3, a desired high frequency noise gain for a TIA disclosed herein may be determined by using any suitable capacitance value defined by capacitors operable to use in the TIA and expected total parasitic capacitance generated by electrical components in the TIA. In one example, a capacitance value of 10 nF of a first capacitance (specifically "C1"), a capacitance value of 10 nF of a second capacitance (specifically "C2"), and a parasitic capacitance of 10 pF of a total parasitic capacitance (specifically "Cp") to calculate a high frequency noise gain value of about 66 decibels. In other exemplary embodiments, any suitable high frequency noise gain for a TIA may be determined by use of Equation 3.

Figure 4:
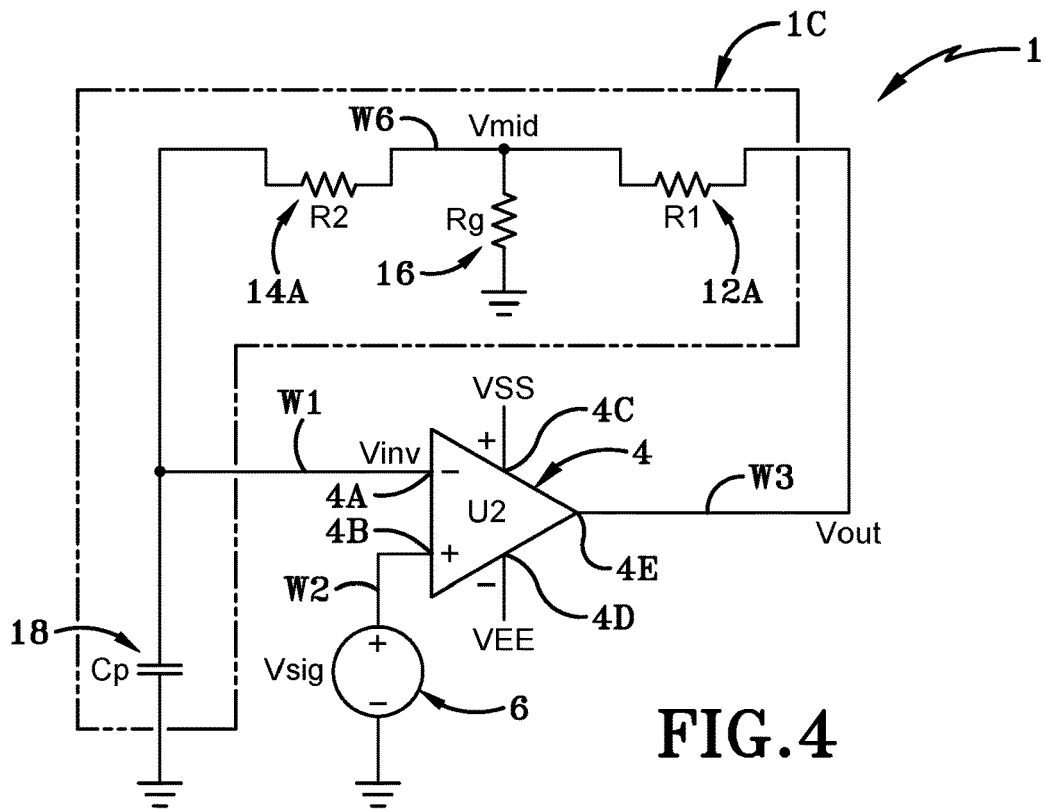
FIG. 4 is a schematic diagram of a first zero breakpoint model of the transimpedance amplifier system.
Figure 5:
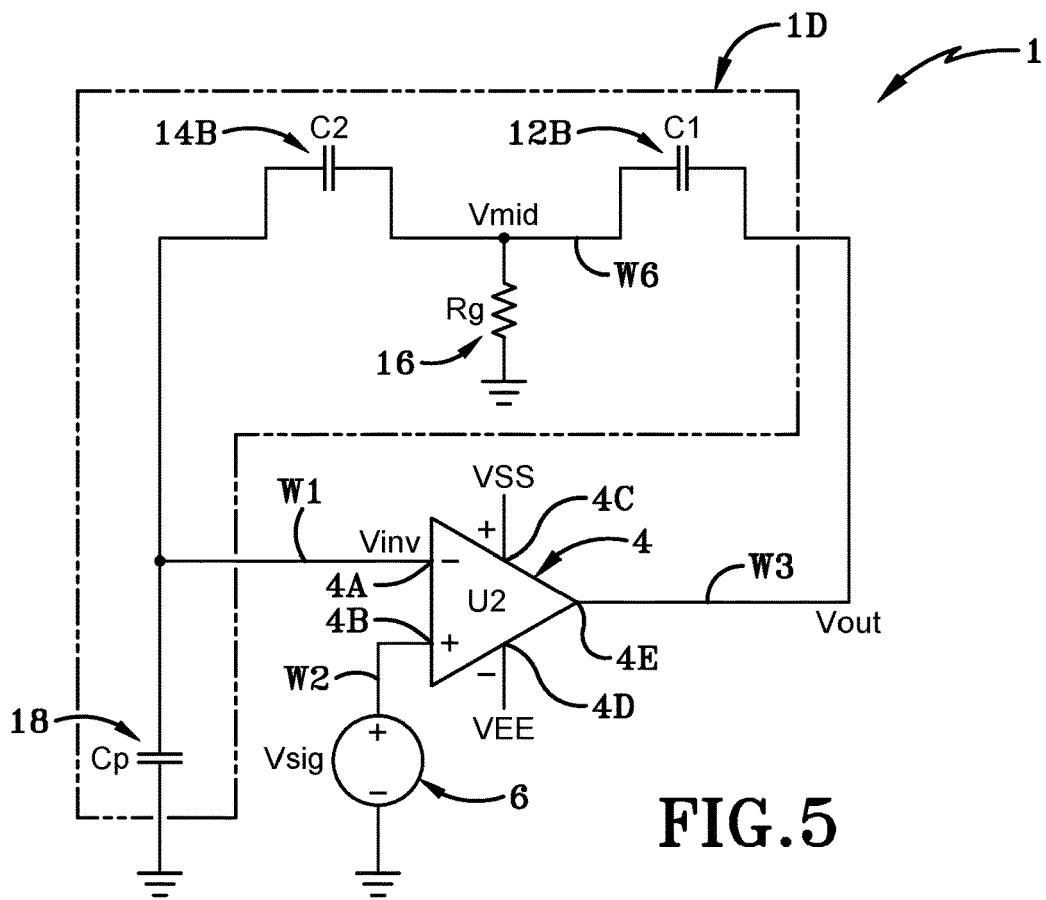
FIG. 5 is a schematic diagram of a second zero breakpoint model of the transimpedance amplifier system.

Referring to FIGS. 4 and 5, TIA 1 includes a first zero breakpoint model 1C (see FIG. 4) and a second zero breakpoint model 1D (see FIG. 5) due to the implementations of the T-network feedback architecture 10 with the op-amp 4 (i.e., the first impedance network 12, the second impedance network 14, and the third resistor 16). It should be understood that the first and second zero breakpoint models 1C, 1D are outlined in dashed boxes in FIGS. 4 and 5.

Referring to FIG. 4, the schematic diagram of TIA 1 illustrates the first zero breakpoint model 1C of TIA 1 for determining the first zero of TIA 1. Here, the first zero breakpoint model 1C of TIA 1 includes the first, second, and third resistors 12A, 14A, 16 of the T-network feedback architecture 10 along with the overall parasitic capacitance 18 defining the total parasitic capacitance value "Cp". Here, the first zero of TIA 1 is determined by Equation 4, which is the value of the numerator from the transfer function of the overall noise gain function described and illustrated above in Equation 1:

$$\text{Zero \#1} = \frac{1}{(2\pi \cdot Cp \cdot [R1 + Rg||R2])} \quad \text{Equation 4}$$

where "Cp" is the total equivalent parasitic capacitance value connected to the inverting input terminal 4A of the op-amp 4, "R1" is the first resistance value of the first resistor 12A (previously described above), "R2" is the second resistance value of the second resistor 14A (previously described above), and "Rg" is the third or ground resistance value of the third resistor 16 (previously described above). With Equation 4, a designer of TIA 10 is able to determine desired resistance values in order for the T-network feedback architecture 10 to prevent issues pertaining to stability of high signal gain and high signal bandwidth while mitigating or minimizing parasitic capacitance generated by feedback components and other components electrically connected at the first input terminal of the op-amp 4. In one example, the first zero may be determined to be 1.58 hertz where the value of "Cp" is 10 μF, the value of "R1" is 10 kΩ, the value of "R2" is 10 kΩ, and the value or "Rg" is 10Ω.

Referring to FIG. 5, the schematic diagram of TIA 1 illustrates the second zero breakpoint model 1D of TIA 1 for determining the second zero of TIA 1. Here, the second zero breakpoint model 1D of TIA 1 includes the first and second capacitors 12B, 14B and the third resistor 16 of the T-network feedback architecture 10 along with the total equivalent parasitic capacitance "Cp" at the inverting input terminal 4A of the op-amp 4. Here, the second zero of TIA 1 is determined by Equation 5, which is the value of the numerator from the transfer function of the overall noise gain:

$$\text{Zero \#2} = \frac{1}{\left(2\pi \cdot \left[\frac{(C1 \cdot Cp)}{(C1 + Cp)} + C2\right] \cdot Rg\right)} \quad \text{Equation 5}$$

where "Cp" is the total equivalent parasitic capacitance value connected to the inverting input terminal 4A of the op-amp 4, "C1" is the first capacitance value of the first capacitor 12B (previously described above), "C2" is the second capacitance value of the second capacitor 14B (previously described above), and "Rg" is the third or ground resistance value of the third resistor 16 (previously described above). With Equation 5, a designer of TIA is able to determine desired values in order for the T-network feedback architecture 10 to prevent issues pertaining to stability of high signal gain and high signal bandwidth while mitigating or minimizing parasitic capacitance generated by feedback components and other components electrically connected at the first input terminal of the op-amp 4. In one example, the second zero may be determined to be 796 kilohertz where the value of "Cp" is 10 µF, the value of "C1" is 10 nF, the value of "C2" is also 10 nF, and the value or "Rg" is 10Ω.

Figure 6:
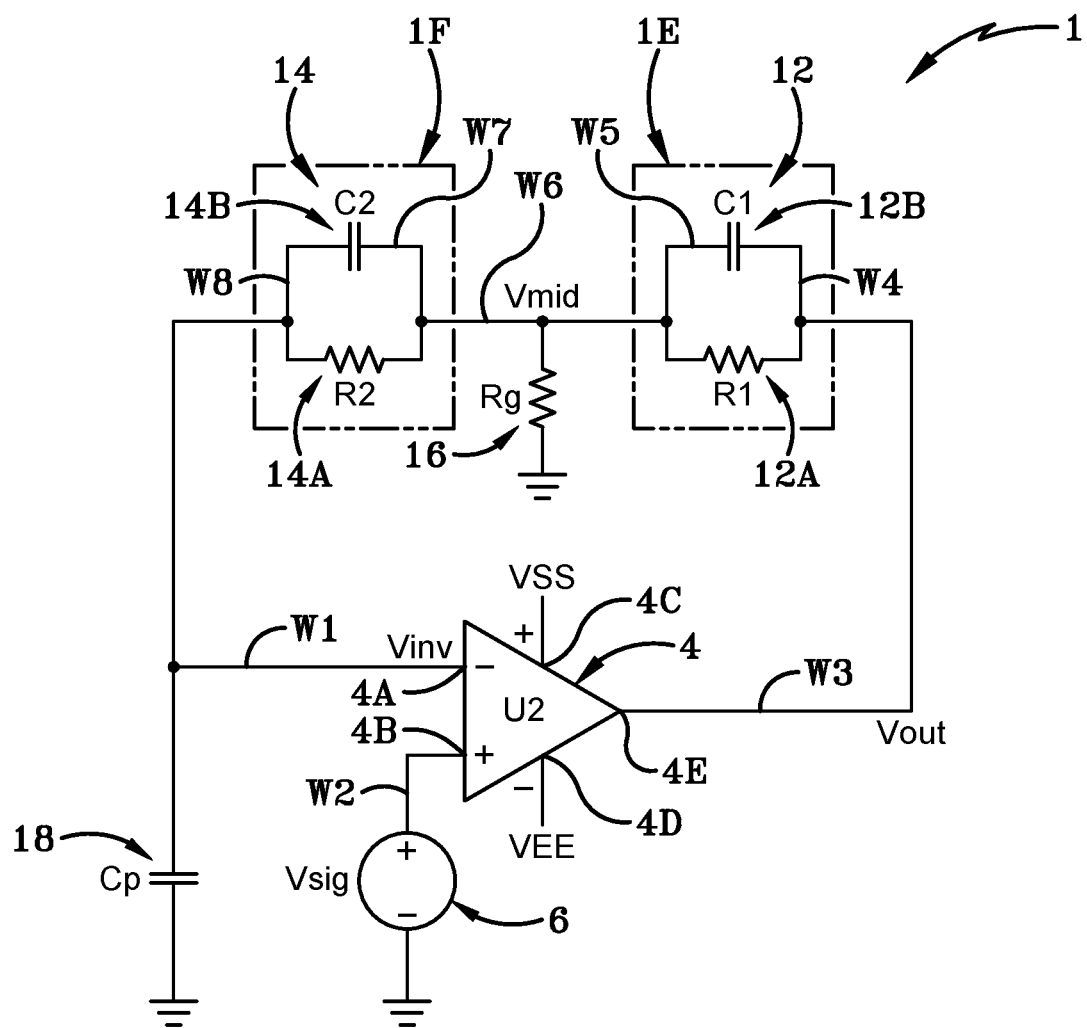
FIG. 6 is a schematic diagram of first and second pole breakpoint models of the transimpedance amplifier system.

Referring to FIG. 6, TIA 1 includes a first pole breakpoint model 1E and a second pole breakpoint model 1F due to the implantation of the first impedance network 12 having the first resistor 12A and the first capacitance 12B and the second impedance network 14 having the second resistor 14A and the second capacitance 14B. It should be understood that the first and second pole breakpoint models 1E, 1F are outlined in dashed boxes in FIG. 6 for the first impedance network 12 and the second impedance network 14. By having two pole breakpoint models 1E, 1F in the T-network feedback architecture 10 disclosed herein, the T-network feedback architecture 10 prevents against stability issues pertaining to high signal gain and high signal bandwidth while mitigating or minimizing parasitic capacitance generated by feedback components and other components electrically connected at the first input terminal of the op-amp 4.

Still referring to FIG. 6, the schematic diagram of TIA 1 illustrates the first pole breakpoint model 1E of TIA 1 for determining the first pole of TIA 1 of the first impedance network 12 of the T-network feedback architecture 10. Here, the first pole of TIA 1 is determined by Equation 6, which is the value of the denominator from the transfer function of the overall noise gain function described and illustrated above in Equation 1:

$$\text{Pole \#1} = \frac{1}{(2\pi \cdot C1 \cdot R1)} \qquad \text{Equation 6}$$

where "C1" is the first capacitance value of the first capacitor 12B of the first impedance network 12 (previously described above) and the "R1" is the first resistance value of the first resistor 12A of the first impedance network 12 (previously described above). With Equation 6, a designer of TIA is able to determine desired values in order for the T-network feedback architecture 10 to prevent issues pertaining to stability of high signal gain and high signal bandwidth while mitigating or minimizing parasitic capacitance generated by feedback components and other components electrically connected at the first input terminal of the op-amp 4. In one example, the first pole may be determined to be 1.59 kilohertz where the value of "C1" is 10 nF and the value of "R1" is 10Ω.

Still referring to FIG. 6, the schematic diagram of TIA 1 illustrates the second pole breakpoint model 1F of TIA 1 for determining the second pole of TIA 1 of the second impedance network 14 of the T-network feedback architecture 10. Here, the second pole of TIA 1 is determined by Equation 7, which is the value of the denominator from the transfer function of the overall noise gain function described and illustrated above in Equation 1:

$$\text{Pole \#2} = \frac{1}{(2\pi \cdot C2 \cdot R2)} \qquad \text{Equation 7}$$

where "C2" is the second capacitance value of the second capacitor 14B of the second impedance network 14 (previously described above) and the "R2" is the second resistance value of the second resistor 14A of the second impedance network 14 (previously described above). With Equation 7, a designer of TIA is able to determine desired values in order for the T-network feedback architecture 10 to prevent issues pertaining to stability of high signal gain and high signal bandwidth while mitigating or minimizing parasitic capacitance generated by feedback components and other components electrically connected at the first input terminal of the op-amp 4. In one example, the second pole may be determined to be 1.59 kilohertz where the value of "C2" is 10 nF and the value of "R2" is 10Ω.

Having now described the components of the TIA 1, a method of using TIA 1 to amplify electrical current output from the at least one sensor 2 while mitigating or minimizing parasitic capacitance is described in more detail below.

During operation of TIA 1, the at least one sensor 2 is configured to detect and gather data for a desired purpose based on the configuration of the at least one sensor 2. In this illustrated embodiment, the at least one sensor 2 is a photodiode that detects and captures a desired light source for a desired purpose. Upon capturing, the at least one sensor 2 converts this data (e.g., light source) into a current signal. The current signal of the at least one sensor 2 is then outputted to the first input terminal 4A of the op-amp 4 via the first electrical connection W1. The current signal outputted to the op-amp 4 is then converted from a current signal to a voltage signal via the properties and configurations of the ideal op-amp 4 in conjunction with the T-network 10. Additionally, a common mode voltage signal may also be outputted from the common mode voltage source 6 to the second input terminal 4B of the op-amp 4 via the second electrical connection W2. Such use of the common mode voltage signal assists in the prevention of generating distorted output signals in TIA 1 by managing the input voltage being delivered into the op-amp 4 during operation due to potential saturation problems with single supply applications, operating outside input voltage range or common mode range specifications, and clipping from second stage downstream circuitry.

Once the current signal is converted to a voltage signal via the op-amp 4, the op-amp 4 outputs the voltage signal at a first gain value to the T-network feedback architecture 10. Specifically, the voltage signal is outputted from the output terminal 4E of the op-amp 4 to the input terminal of the first impedance network 12 via the third electrical connection W3. Once the voltage signal is outputted to the first impedance network 12, the voltage signal then travels through the first resistor 12A and the first capacitor 12B of the first impedance network 12. Upon traveling through the first impedance network 12, the first impedance network 12 outputs the voltage signal at a second gain value via the first resistance value "R1" and the first capacitance value "C1" of the first resistor 12A and the first capacitor 12B of the first impedance network 12. At this stage, the second gain value of the voltage signal outputted by the first impedance network 12 is different than the first gain value of the voltage signal outputted by the op-amp 4.

Once the voltage signal is outputted from the first impedance network 12 at the second gain value, the voltage signal is then outputted to the ground resistor 16 and to the second impedance network 14 via the sixth electrical connection W6. Specifically, the voltage signal with the second gain value is outputted from an output of the first impedance network 12 to an input of the second impedance network 14 via the sixth electrical connection W6. Once the voltage signal is outputted to the second impedance network 14, the voltage signal then travels through the second resistor 14A and the second capacitor 14B of the second impedance network 14. Upon traveling through the second impedance network 14, the second impedance network 14 outputs the voltage signal at a third gain value via the second resistance value "R2" and the second capacitance value "C2" of the second resistor 14A and the second capacitor 14B of the second impedance network 14. Additionally, the voltage signal of the second gain value outputted from the first impedance network 12 travels through the ground resistor 16 which includes the third resistance value "Rg".

One the voltage signal is outputted from the second impedance network 14 at the third gain value, the voltage signal with the third gain value is feed back into the op-amp 4 via the first electrical connection W1. Specifically, the voltage signal with the first gain value is outputted from an output of the second impedance network 14 to the first input terminal 4A of the op-amp 4 via the first electrical connection W1.

As such, this process may be repeated for a desired amount of time or cycles in TIA 1 at which the voltage signal may be provided at a low gain and low bandwidth value or provided at a high gain and high bandwidth value. As discussed previously, TIA 1 with the T-network feedback architecture 10 enables the use of allowing high gain and high bandwidth signals by mitigating the issues of parasitic capacitances associated with components provided in TIA 1 and/or devices electrically connected with TIA 1.

Figure 7:
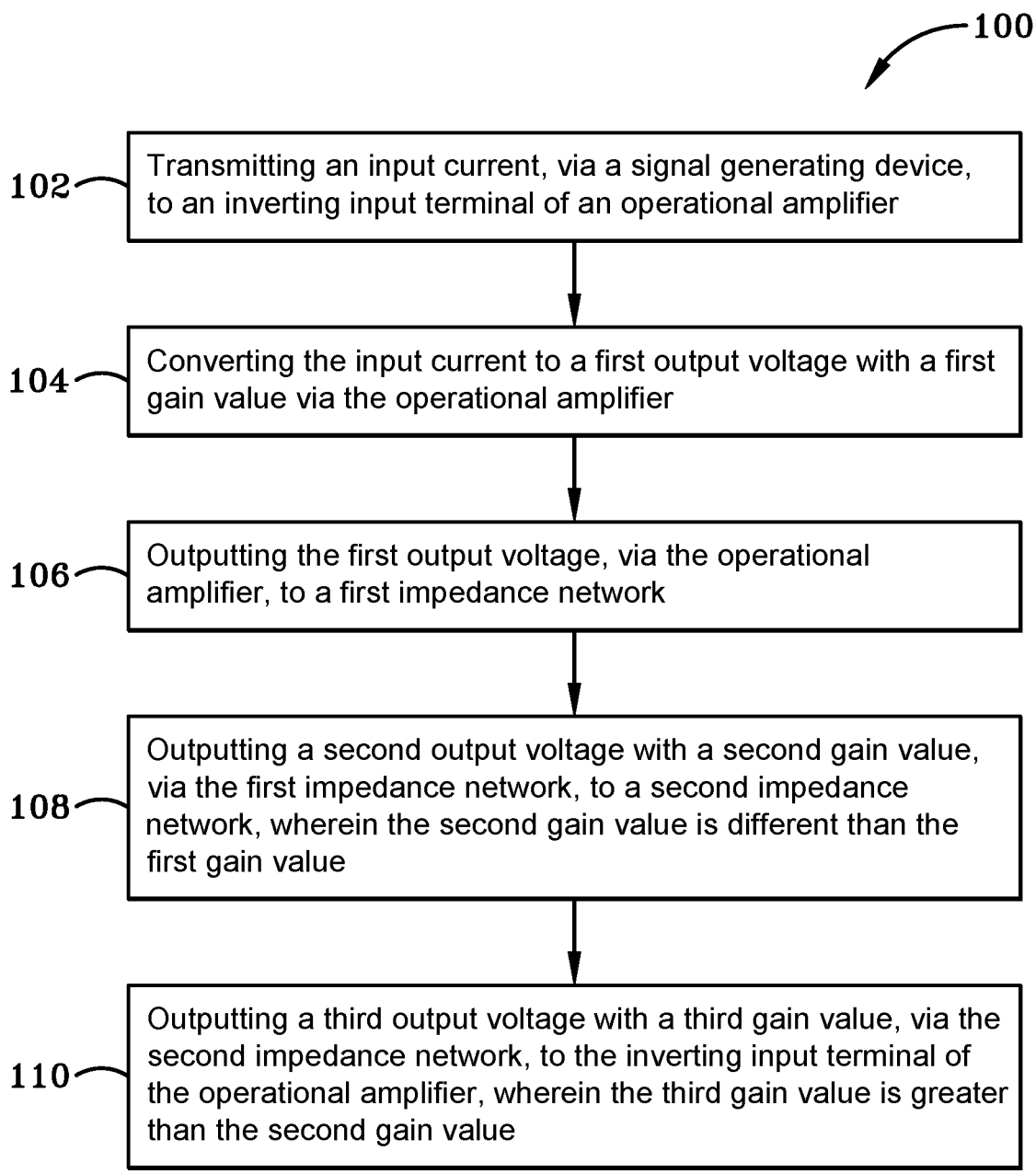
FIG. 7 is a method flowchart.

FIG. 7 illustrate a method 100. An initial step 102 of the method 100 comprises transmitting an input current, via a signal generating device, to an inverting input terminal of an operational amplifier. Another step 104 comprises converting the input current to a first output voltage with a first gain value via the operational amplifier. Another step 106 comprises outputting the first output voltage, via the operational amplifier, to a first impedance network. Another step 108 comprises outputting a second output voltage with a second gain value, via the first impedance network, to a second impedance network, wherein the second gain value is different than the first gain value. Another step 110 comprises outputting a third output voltage with a third gain value, via the second impedance network, to an inverting input terminal of the operational amplifier, wherein the third gain value is greater than the second gain value.

In other exemplary embodiments, method 100 may include additional steps. An optional step may further comprise that the step of outputting a second output voltage with a second gain value, via the first impedance network, to a second impedance network further includes that the first impedance network comprises: defining a first resistance value by a first resistor; and defining a first capacitance value by a first capacitor. An optional step may further comprise that the step of outputting a third output voltage with a third gain value, via the second impedance network, to the inverting input terminal of the operational amplifier further includes that the second impedance network comprises: defining a second resistance value by a second resistor that is equal to the first resistance value defined by the first resistor; and defining a second capacitance value by a second capacitor that is equal to the first capacitance value defined by the first capacitor. An optional step may further comprise outputting the second output voltage with the second gain value, via the first impedance network, to a third resistor defining a third resistance value that is less than the first resistance value of the first resistor and less than the second resistance value of the second resistor.

Various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, embodiments of technology disclosed herein may be implemented using hardware, software, or a combination thereof. When implemented in software, the software code or instructions can be executed on any suitable processor or collection of processors, whether provided in a single computer or distributed among multiple computers. Furthermore, the instructions or software code can be stored in at least one non-transitory computer readable storage medium.

Also, a computer or smartphone utilized to execute the software code or instructions via its processors may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers or smartphones may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes outlined herein may be coded as software/instructions that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, USB flash drives, SD cards, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the disclosure discussed above. The computer readable medium or media can be transportable, such that the program or programs stored thereon can be loaded onto one or more different computers or other processors to implement various aspects of the present disclosure as discussed above.

The terms "program" or "software" or "instructions" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present disclosure need not reside on a single computer or processor, but may be distributed in a modular fashion amongst a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically, the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

All definitions, as defined and used herein, should be understood to control over dictionary definitions, definitions in documents incorporated by reference, and/or ordinary meanings of the defined terms.

"Logic", as used herein, includes but is not limited to hardware, firmware, software and/or combinations of each to perform a function(s) or an action(s), and/or to cause a function or action from another logic, method, and/or system. For example, based on a desired application or needs, logic may include a software controlled microprocessor, discrete logic like a processor (e.g., microprocessor), an application specific integrated circuit (ASIC), a programmed logic device, a memory device containing instructions, an electric device having a memory, or the like. Logic may include one or more gates, combinations of gates, or other circuit components. Logic may also be fully embodied as software. Where multiple logics are described, it may be possible to incorporate the multiple logics into one physical logic. Similarly, where a single logic is described, it may be possible to distribute that single logic between multiple physical logics.

Furthermore, the logic(s) presented herein for accomplishing various methods of this system may be directed towards improvements in existing computer-centric or internet-centric technology that may not have previous analog versions. The logic(s) may provide specific functionality directly related to structure that addresses and resolves some problems identified herein. The logic(s) may also provide significantly more advantages to solve these problems by providing an exemplary inventive concept as specific logic structure and concordant functionality of the method and system. Furthermore, the logic(s) may also provide specific computer implemented rules that improve on existing technological processes. The logic(s) provided herein extends beyond merely gathering data, analyzing the information, and displaying the results. Further, portions or all of the present disclosure may rely on underlying equations that are derived from the specific arrangement of the equipment or components as recited herein. Thus, portions of the present disclosure as it relates to the specific arrangement of the components are not directed to abstract ideas. Furthermore, the present disclosure and the appended claims present teachings that involve more than performance of well-understood, routine, and conventional activities previously known to the industry. In some of the method or process of the present disclosure, which may incorporate some aspects of natural phenomenon, the process or method steps are additional features that are new and useful.

The articles "a" and "an," as used herein in the specification and in the claims, unless clearly indicated to the contrary, should be understood to mean "at least one." The phrase "and/or," as used herein in the specification and in the claims (if at all), should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc. As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

As used herein in the specification and in the claims, the term "effecting" or a phrase or claim element beginning with the term "effecting" should be understood to mean to cause something to happen or to bring something about. For example, effecting an event to occur may be caused by actions of a first party even though a second party actually performed the event or had the event occur to the second party. Stated otherwise, effecting refers to one party giving another party the tools, objects, or resources to cause an event to occur. Thus, in this example a claim element of "effecting an event to occur" would mean that a first party is giving a second party the tools or resources needed for the second party to perform the event, however the affirmative single action is the responsibility of the first party to provide the tools or resources to cause said event to occur.

When a feature or element is herein referred to as being "on" another feature or element, it can be directly on the other feature or element or intervening features and/or elements may also be present. In contrast, when a feature or element is referred to as being "directly on" another feature or element, there are no intervening features or elements present. It will also be understood that, when a feature or element is referred to as being "connected", "attached" or "coupled" to another feature or element, it can be directly connected, attached or coupled to the other feature or element or intervening features or elements may be present. In contrast, when a feature or element is referred to as being "directly connected", "directly attached" or "directly coupled" to another feature or element, there are no intervening features or elements present. Although described or shown with respect to one embodiment, the features and elements so described or shown can apply to other embodiments. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "above", "behind", "in front of", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly. Similarly, the terms "upwardly", "downwardly", "vertical", "horizontal", "lateral", "transverse", "longitudinal", and the like are used herein for the purpose of explanation only unless specifically indicated otherwise.

Although the terms "first" and "second" may be used herein to describe various features/elements, these features/elements should not be limited by these terms, unless the context indicates otherwise. These terms may be used to distinguish one feature/element from another feature/element. Thus, a first feature/element discussed herein could be termed a second feature/element, and similarly, a second feature/element discussed herein could be termed a first feature/element without departing from the teachings of the present invention.

An embodiment is an implementation or example of the present disclosure. Reference in the specification to "an embodiment," "one embodiment," "some embodiments," "one particular embodiment," "an exemplary embodiment," or "other embodiments," or the like, means that a particular feature, structure, or characteristic described in connection with the embodiments is included in at least some embodiments, but not necessarily all embodiments, of the invention. The various appearances "an embodiment," "one embodiment," "some embodiments," "one particular embodiment," "an exemplary embodiment," or "other embodiments," or the like, are not necessarily all referring to the same embodiments.

If this specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

As used herein in the specification and claims, including as used in the examples and unless otherwise expressly specified, all numbers may be read as if prefaced by the word "about" or "approximately," even if the term does not expressly appear. The phrase "about" or "approximately" may be used when describing magnitude and/or position to indicate that the value and/or position described is within a reasonable expected range of values and/or positions. For example, a numeric value may have a value that is +/−0.1% of the stated value (or range of values), +/−1% of the stated value (or range of values), +/−2% of the stated value (or range of values), +/−5% of the stated value (or range of values), +/−10% of the stated value (or range of values), etc. Any numerical range recited herein is intended to include all sub-ranges subsumed therein.

Additionally, the method of performing the present disclosure may occur in a sequence different than those described herein. Accordingly, no sequence of the method should be read as a limitation unless explicitly stated. It is recognizable that performing some of the steps of the method in a different order could achieve a similar result.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration of various embodiments of the disclosure are examples and the disclosure is not limited to the exact details shown or described.

What is claimed:

1. A transimpedance amplifier system, comprising:
   an operational amplifier having a first input terminal, a second input terminal, and an output terminal;
   a T-network feedback architecture operatively connected with the operational amplifier at the first input terminal of the operational amplifier and the output terminal of the operational amplifier, the T-network feedback architecture having a first impedance network and a second impedance network;
   a first capacitor of the first impedance network operatively connected with the output terminal of the operational amplifier;
   a first resistor of the first impedance network operatively connected with the output terminal of the operational amplifier;
   a second capacitor of the second impedance network operatively connected with the second input terminal of the operational amplifier and the second capacitor in series with first impedance network; and
   a second resistor of the second impedance network operatively connected with the second input terminal of the operational amplifier and the second resistor in series with first impedance network;
   wherein the second capacitor of the second impedance network is in parallel with the second resistor of the second impedance network;
   wherein the first capacitor of the first impedance network is in parallel with the first resistor of the first impedance network;
   wherein the T-network feedback architecture is configured to suppress parasitic capacitance from the transimpedance amplifier system;
   wherein the first impedance network is in series with the output terminal of the operational amplifier; and
   wherein the second impedance network is in series with the first impedance network and operatively connected with the first input terminal of the operational amplifier.

2. The system of claim 1, wherein the T-network feedback architecture further comprises:
   a first pole having a first value generated by the first impedance network; and
   a second pole having a second value generated by the second impedance network.

3. The system of claim 2, wherein the first pole value and the second pole value are set equal to one another.

4. The system of claim 2, wherein the first pole value and the second pole value are set different from one another.

5. The system of claim 1, wherein the T-network feedback architecture further comprises:
   a ground resistor operatively connected with an output of the first impedance network and operatively connected with an input of the second impedance network.

6. The system of claim 5, wherein the T-network feedback architecture further comprises:
   a first resistance value defined by the first resistor;
   a second resistance value defined by the second resistor; and
   a third resistance value defined by the ground resistor;
   wherein the third resistance value is different than each of the first resistance value and the second resistance value.

7. The system of claim 6, wherein the third resistance value of the ground resistor is greater than each of the first resistance value of the first resistor and the second resistance value of the second resistor.

8. The system of claim 6, wherein the third resistance value of the ground resistor is less than each of the first resistance value of the first resistor and the second resistance value of the second resistor.

9. The system of claim 8, further comprising:
   a third capacitor in series with the T-network feedback architecture and operatively connected with the first input terminal of the operational amplifier; and
   a first zero value generated by the first resistor, the second resistor, the third resistor, and the third capacitor.

10. The system of claim 9, wherein the T-network feedback architecture further comprises:
    a first capacitance value defined by the first capacitor of the first impedance network; and
    a second capacitance value defined by the second capacitor of the second impedance network;
    wherein the first capacitance value and the second capacitance value is equal to one another; and
    wherein the first capacitance value and the second capacitance value is greater than the parasitic capacitance imposed across each of first impedance network and the second impedance network.

11. The system of claim 9, wherein the T-network feedback architecture further comprises:
    a first capacitance value defined by the first capacitor of the first impedance network; and
    a second capacitance value defined by the second capacitor of the second impedance network;
    wherein the first capacitance value and the second capacitance value is different from one another; and
    wherein the first capacitance value and the second capacitance value is greater than the parasitic capacitance imposed across each of first impedance network and the second impedance network.

12. The system of claim 10, further comprising:
a second zero value generated by the first capacitor, the second capacitor, the third capacitor, and the third resistor, wherein the second zero value is greater than the first zero value.

13. A T-network feedback architecture with an operational amplifier, comprising:
a first impedance network in series with an output terminal of the operational amplifier;
a second impedance network in series with the first impedance network and operatively connected with an input terminal of the operational amplifier;
a first pole having a first value generated by the first impedance network;
a second pole having a second value generated by the second impedance network;
a first capacitor of the first impedance network operatively connected with the output terminal of the operational amplifier;
a first resistor of the first impedance network operatively connected with the output terminal of the operational amplifier;
a second capacitor of the second impedance network operatively connected with the second input terminal of the operational amplifier and in series with first impedance network; and
a first resistor of the second impedance network operatively connected with the second input terminal of the operational amplifier and in series with first impedance network;
wherein the second capacitor of the second impedance network is in parallel with the second resistor of the second impedance network;
wherein the first capacitor of the first impedance network is in parallel with the first resistor of the first impedance network; and
wherein the first pole value and the second pole value are set equal to one another.

14. The system of claim 13, wherein the T-network feedback architecture further comprises:
a ground resistor operatively connected with an output of the first impedance network and operatively connected with an input of the second impedance network.

15. A method, comprising steps of:
transmitting an input current, via a signal generating device, to an inverting input terminal of an operational amplifier;
converting the input current to a first output voltage with a first gain value via the operational amplifier;
outputting the first output voltage, via the operational amplifier, to a first impedance network;
outputting a second output voltage with a second gain value, via the first impedance network, to a second impedance network, wherein the second gain value is different than the first gain value; and
outputting a third output voltage with a third gain value, via the second impedance network, to the inverting input terminal of the operational amplifier, wherein the third gain value is greater than the second gain value;
wherein the step of outputting a second output voltage with a second gain value, via the first impedance network, to a second impedance network further includes that the first impedance network comprises:
defining a first resistance value by a first resistor; and
defining a first capacitance value by a first capacitor; and
wherein the step of outputting a third output voltage with a third gain value, via the second impedance network, to the inverting input terminal of the operational amplifier further includes that the second impedance network comprises:
defining a second resistance value by a second resistor that is equal to the first resistance value defined by the first resistor; and
defining a second capacitance value by a second capacitor that is equal to the first capacitance value defined by the first capacitor.

16. The method of claim 15, further comprising:
outputting the second output voltage with the second gain value, via the first impedance network, to a third resistor defining a third resistance value that is less than the first resistance value of the first resistor and less than the second resistance value of the second resistor.

* * * * *